United States Patent
Minden

(10) Patent No.: US 6,707,832 B2
(45) Date of Patent: Mar. 16, 2004

(54) FIBER COUPLING ENHANCEMENT VIA EXTERNAL FEEDBACK

(75) Inventor: Monica Minden, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/329,325

(22) Filed: Dec. 23, 2002

(65) Prior Publication Data

US 2003/0165176 A1 Sep. 4, 2003

Related U.S. Application Data

(60) Provisional application No. 60/348,893, filed on Jan. 15, 2002.

(51) Int. Cl.$^7$ .............................................. H01S 3/098
(52) U.S. Cl. .............................. 372/19; 372/6; 372/102; 372/69
(58) Field of Search .......................... 372/6, 108, 19, 372/69

(56) References Cited

U.S. PATENT DOCUMENTS

| | | |
|---|---|---|
| 4,794,615 A | 12/1988 | Berger et al. |
| 4,969,155 A | 11/1990 | Kahan |
| 5,222,094 A | 6/1993 | Hanna et al. |
| 5,568,577 A | 10/1996 | Hardy, Jr. et al. |
| 5,572,541 A | 11/1996 | Suni |
| 5,589,684 A | 12/1996 | Ventrudo et al. |
| 5,590,147 A | 12/1996 | Hobbs et al. |
| 5,600,665 A | 2/1997 | Minden et al. |
| 5,647,038 A | 7/1997 | Minden et al. |
| 5,745,617 A | 4/1998 | Starodubov et al. |
| 5,790,722 A | 8/1998 | Minden et al. |
| 5,814,821 A | 9/1998 | Reusch et al. |
| 5,825,551 A | 10/1998 | Clarkson et al. |
| 5,881,186 A | 3/1999 | Starodubov |
| 5,881,188 A | 3/1999 | Starodubov |
| 5,972,542 A | 10/1999 | Starodubov |
| 6,041,072 A | 3/2000 | Ventrudo et al. |
| 6,275,250 B1 * | 8/2001 | Sanders et al. ............. 347/247 |
| 2003/0119291 A1 * | 6/2003 | Ahn et al. .................. 438/591 |
| 2003/0161569 A1 * | 8/2003 | Braun et al. ................. 385/12 |
| 2003/0165176 A1 * | 9/2003 | Minden ..................... 372/108 |
| 2003/0165313 A1 * | 9/2003 | Broeng et al. .............. 385/125 |

* cited by examiner

Primary Examiner—Leon Scott, Jr.
(74) Attorney, Agent, or Firm—Tope-McKay & Associates

(57) ABSTRACT

The present invention provides for the coupling of laser diodes into electromagnetic radiation transmitting fibers wherein coupling efficiency is improved by improving the spatial brightness of multi-mode diode lasers as they are coupled into double-clad fibers. A Bragg grating 100 is fabricated into the core 102 of a double-clad fiber 104 coupled to a multi-mode diode laser 106. The output 108 from the multi-mode diode laser 106 is coupled into the core 102 and inner cladding 110 of the double-clad fiber by proximity or by one or more focusing objectives 112. The Bragg grating 100 in the core 102 of the double-clad fiber 104 is written at the wavelength of the multi-mode diode laser 106. The original output 108 from the multi-mode diode laser 106 strikes the Bragg grating 100 which reflects feedback 114 back to the diode laser 106.

16 Claims, 1 Drawing Sheet

FIBER COUPLING ENHANCEMENT VIA EXTERNAL FEEDBACK

This application claims the benefit of prov. application No. 60/348,893 filed on Jan. 15, 2002.

FIELD OF THE INVENTION

The present invention relates to coupling of laser diodes into fibers. More specifically, the present invention relates to improving coupling efficiency by improving the spatial brightness of multi-mode diode lasers as they are coupled into double-clad fibers.

BACKGROUND OF THE INVENTION

Presently, power-scaled fiber lasers are required in a variety of applications, including optical satellite and free space communication links, laser radars, high power fiber delivery systems for manufacturing, and missile guidance systems. Typically, power-scaling in a fiber amplifier is achieved by coupling large-aperture multi-mode laser diodes into the inner cladding of a double-clad fiber. Dopant ions present in the core of the double-clad fiber are optically pumped by the output of the multi-mode diode guided by the inner cladding. The distance required to absorb the pump into the core is proportional to the cross-sectional area of the inner cladding. Thus, the smaller the inner cladding diameter that can guide the pump laser, the more efficiently the pump will be absorbed. Diode brightness is defined as proportional to the product of diode power and etendue, the diffractive solid angle of the output times the diode area. Accordingly, in order to achieve efficient coupling between a single-element diode laser and the fiber, the inner cladding must have a area-solid angle product comparable to or larger than the diode laser output. Unfortunately, the multi-mode diode lasers utilized with double-clad fibers provide high power but relatively highly divergent or low brightness output compared to single mode diodes. The highest quality optics cannot compensate for a lack of brightness in the diode. Note, however, that in multi-element diodes, so-called brightness enhancing optics can be used to eliminate the gaps between the elements, allowing a multi-element diode to maintain the brightness of its individual elements. For example, U.S. Pat. Nos. 5,799,029 and 5,930,280 disclose brightness enhancers for systems wherein multiple single-mode laser sources are used, instead of a multi-mode source, to achieve the necessary power. The outputs of these multiple sources can be essentially folded on top of one another to provide high power output. However, this approach, like other previously reported methods for improving multi-mode diode laser brightness, increase the complexity and size of the laser system.

SUMMARY OF THE INVENTION

The present invention provides an apparatus and method whereby the coupling efficiency between a multi-mode diode laser and a double-clad fiber can be enhanced without increasing the complexity or size of the resultant system. In the present invention, the output of a multi-mode diode laser is coupled into both the core and inner cladding of a double-clad fiber. A Bragg grating at the diode laser output wavelength is fabricated into the core of the double-clad fiber. The grating reflects diode laser output from the core back to the diode laser. The reflected feedback enhances the lower order spatial modes at the expense of the higher order modes, and thus enhances the brightness of the resultant diode laser output coupled back into the core and cladding of the fiber. In preferred embodiments of the present invention, a Bragg grating is fabricated in the core of the double-clad fiber by ultraviolet writing techniques known to those skilled in the art. Further, the grating preferably has high absolute reflectivity such that most of the output directed into the core is reflected back to the diode laser. Also, in preferred embodiments of the present invention, the diode laser may be anti-reflection coated to suppress the higher order modes. In addition, in preferred embodiments the bandwidth of the Bragg grating is broadened, for example by spatial chirping, to match the bandwidth of the diode laser such that coupling efficiency is further improved.

DETAILED DESCRIPTION OF THE INVENTION

Figure 1:
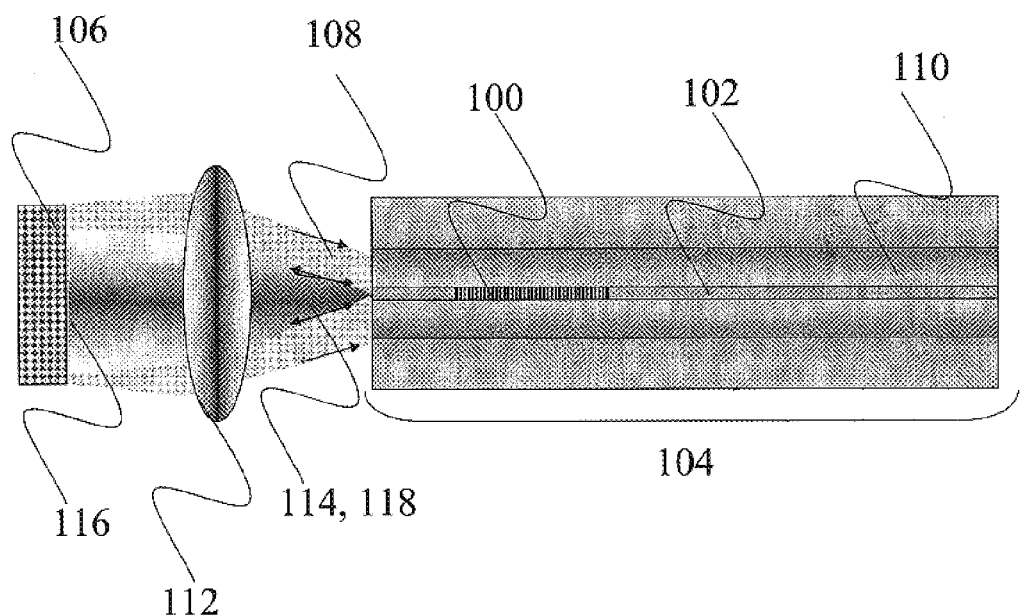
FIG. 1 shows a multi-mode diode laser coupled into a fiber wherein a high reflectivity Bragg grating provides feedback to the diode laser, thereby enhancing the diode laser brightness and coupling efficiency.

The present invention generally provides an apparatus and method for improving coupling between multi-mode diode lasers and double-clad fibers, thereby improving the effective brightness of the diode laser and, accordingly power-scaling capabilities of the fiber. The following description is presented to enable one of ordinary skill in the art to make and use the invention, which may be incorporated in the context of a variety of applications. Various modifications to the preferred embodiment, as well as a variety of uses in different applications will be readily apparent to those skilled in the art. Notably, the general principles defined herein may be applied to other embodiments; thus, the present invention is not intended to be limited to the embodiments shown, but is to be accorded the widest scope consistent with the principles and novel features disclosed herein.

The present invention takes advantage of feedback reflected from a Bragg grating written into the core of a double-clad fiber in order to improve the coupling efficiency between a multi-mode diode laser and a double-clad fiber. A general depiction of the preferred embodiments of the present invention is provided in FIG. 1. In the preferred embodiments of the present invention, a Bragg grating 100 is fabricated into the core 102 of a double-clad fiber 104 coupled to a multi-mode diode laser 106. The output 108 from the multi-mode diode laser 106 is coupled into the core 102 and inner cladding 110 of the double-clad fiber by proximity or by one or more focusing objectives, depicted in FIG. 1 as a single lens, 112. Accpetable focusing objectives include but are not limited to spherical and cylindrical lenses, and spherical and cylindrical curvatures on the end of the double-clad fiber. The Bragg grating 100 in the core 102 of the double-clad fiber 104 is written at the wavelength of the multi-mode diode laser 106. The original output 108 from the multi-mode diode laser 106 strikes the Bragg grating 100 which reflects feedback 114 back to the diode laser 106. In the most preferred embodiment of this invention, the diode is equipped with an anti-reflective coating 116 to help suppress the high order modes of the diode.

The feedback 114 from the Bragg grating 100 in the fiber core enhances those lower order modes of the original diode laser output 108 that have the same general spatial configuration as the feedback 114. This enhancement occurs at the expense of the higher order modes of the diode laser that have the same general spatial configuration as the original divergent output 108. Thus, the resultant enhanced diode output 118 has the same spatial configuration as the feedback 114. The enhanced diode output 118 and the feedback 114 are represented by the same shaded area on FIG. 1. Thus the present invention provides improved coupling between the multi-mode diode laser 106 and the double-clad fiber 104 and, accordingly, enhanced brightness. The feedback system according to the present invention may be considered to function as an unstable oscillator.

In the present invention as depicted in FIG. 1, the multi-mode diode laser 106 is coupled both to the inner cladding 112 and the core 102 of the double-clad fiber 104. Because the present invention is intended for a double-clad fiber laser system in a power-scaling application, output 108 from the multi-mode diode laser 106 need not traverse the core of the double-clad fiber 104 in the region of the Bragg grating 104. Thus, in preferred embodiments of the present invention, the Bragg grating 100 fabricated in the core 102 of the double-clad fiber 104 has a high absolute reflectivity in order to maximize feedback to the multi-mode diode laser 106.

It should be noted that the embodiments of the present invention herein presented do not provide pure single mode spatial output 108 from the diode laser 106. Contamination of the output 108 by additional modes (or degradation of the beam quality) occurs, for example, because the shape of a single mode within the core of a double-clad fiber 104 is not identical to the shape of a low-order diode wave-guide mode. In addition, aberrations inherent to the coupling optics cannot provide perfect mapping.

In preferred embodiments of the present invention, the Bragg grating 100 has a bandwidth that is matched to the bandwidth of the multi-mode diode laser 106 in order to obtain maximum feedback efficiency. Broadening of the grating bandwidth would likely be required in order to match the laser bandwidth. Such broadening can be achieved by spatially chirping or other techniques known to those skilled in the art.

Furthermore, in preferred embodiments of the invention, the core 102 of the double-clad fiber 104 of the present invention is photosensitive to UV radiation. UV-photosensitivity facilitates the fabrication of the Bragg grating 100 into the core 102 by writing techniques known to those skilled in the art.

Additional embodiments of the present invention also include a multi-mode diode laser with a broad field of view. In such systems, the presence of a Bragg grating in the double-clad fiber permits preferential selection of laser modes that are easily focused into the target fiber. Thus, alignment can be simplified.

What is claimed is:

1. An apparatus for coupling a multi-mode diode laser to a double-clad fiber, comprising:
   a. a multi-mode diode laser having an output of electromagnetic radiation wherein the output has brightness, wavelength, and lower order and higher order spatial modes;
   b. a double-clad fiber comprising an outer cladding, an inner cladding with a dopant that is substantially photoexcited by the output from the multi-mode diode laser, and an inner core substantially transparent to the output of the multi-mode diode laser, and further comprising an end whereby electromagnetic radiation can be directed into the core and cladding, and;
   c. a focusing objective, wherein:
      i. the multi-mode diode laser, focusing objective and double-clad fiber are aligned, such that the output from the multi-mode laser is substantially directed through the focusing objective to the end of the double-clad fiber; and,
      ii. a Bragg grating having a reflectivity is fabricated within the core of the double-clad fiber at the wavelength of the multi-mode diode laser so that output from the multi-mode diode laser is reflected back to the multi-mode diode laser such that the lower order spatial modes of the diode laser are enhanced and, thereby, the brightness of the multi-mode diode laser output that is coupled back into the core and inner cladding of the double-clad fiber is also enhanced.

2. The apparatus for coupling a multi-mode diode laser to a double-clad fiber as set forth in claim 1, wherein the multimode-mode diode laser further has a surface running perpendicular to the diode output said surface has an anti-reflective coating.

3. The apparatus for coupling a multi-mode diode laser to a double-clad fiber as set forth in claim 1, wherein the multi-mode diode laser and the Bragg grating each have a bandwidth, and the bandwidth of the Bragg grating is broadened to match the bandwidth of the multi-mode diode laser.

4. The apparatus for coupling a multi-mode diode laser to a double-clad fiber as set forth in claim 3, wherein the bandwidth of the Bragg grating is broadened by spatial chirping.

5. The apparatus for coupling a multi-mode diode laser to a double-clad fiber as set forth in claim 1, wherein the core of the double-clad fiber is substantially photosensitive to ultraviolet radiation.

6. The apparatus for coupling a multi-mode diode laser to a double-clad fiber as set forth in claim 5, wherein the Bragg grating is fabricated in the core by an ultraviolet radiation writing technique.

7. The apparatus for coupling a multi-mode diode laser to a double-clad fiber as set forth in claim 1, wherein the reflectivity of the Bragg grating is greater than 10%.

8. The apparatus for coupling a multi-mode diode laser to a double-clad fiber as set forth in claim 7, wherein the reflectivity of the Bragg grating is 100%.

9. A method for coupling a multi-mode diode laser to a double-clad fiber, wherein:
   a. the multi-mode diode laser has an output of electromagnetic radiation wherein the output has brightness, wavelength, and lower order and higher order spatial modes;
   b. the double-clad fiber comprises an outer cladding, an inner core that guides the output from the multi-mode diode laser, and is substantially transparent to the output of the multi-mode diode laser, and further comprises an end whereby electromagnetic radiation can be directed into the core and cladding; said method comprising:
      i. aligning the multi-mode diode laser, any focusing objectives, and the double-clad fiber such that the output from the multi-mode laser is substantially directed into the end of the double-clad fiber; and,
      ii. fabricating a Bragg grating having a reflectivity within the core of the double-clad fiber at the wavelength of the multi-mode diode laser so that output from the multi-mode diode laser is reflected back to the multi-mode diode laser such that the lower order spatial modes of the diode laser are enhanced and, thereby, the brightness of the multi-mode diode laser output that is coupled back into the core and inner cladding of the double-clad fiber is also enhanced.

10. The method for coupling a multi-mode diode laser to a double-clad fiber as set forth in claim 9, wherein the multi-mode diode laser further has a surface perpendicular to the diode laser output, and said surface has an anti-reflective coating.

11. The method for coupling a multi-mode diode laser to a double-clad fiber as set forth in claim 9, wherein the multi-mode diode laser and the Bragg grating each have a bandwidth, and the bandwidth of the Bragg grating is broadened to match the bandwidth of the multi-mode diode laser.

12. The method for coupling a multi-mode diode laser to a double-clad fiber as set forth in claim 11, wherein the bandwidth of the Bragg grating is broadened by spatial chirping.

13. The method for coupling a multi-mode diode laser to a double-clad fiber as set forth in claim 9, wherein the core of the double-clad fiber is substantially photosensitive to ultraviolet radiation.

14. The method for coupling a multi-mode diode laser to a double-clad fiber as set forth in claim 13, wherein the Bragg grating is fabricated by an ultraviolet radiation writing technique.

15. The method for coupling a multi-mode diode laser to a double-clad fiber as set forth in claim 9, wherein the reflectivity of the Bragg grating is greater than 10%.

16. The method for coupling a multi-mode diode laser to a double-clad fiber as set forth in claim 15, wherein the reflectivity of the Bragg grating is 100%.

* * * * *